United States Patent [19]
Naito

[11] Patent Number: 5,121,349
[45] Date of Patent: Jun. 9, 1992

[54] DIGITAL NOISE GENERATOR

[75] Inventor: Yushi Naito, Kamakura, Japan

[73] Assignee: Mitsubishi Denki Kabushiki Kaisha, Tokyo, Japan

[21] Appl. No.: 558,069

[22] Filed: Jul. 25, 1990

[30] Foreign Application Priority Data

Aug. 1, 1989 [JP] Japan .................. 1-200505

[51] Int. Cl.$^5$ .............................. G06F 1/02
[52] U.S. Cl. .................................... 364/717
[58] Field of Search ............... 364/717, 717.05

[56] References Cited

U.S. PATENT DOCUMENTS

| | | | |
|---|---|---|---|
| 3,614,399 | 10/1971 | Linz | 364/717 |
| 4,719,643 | 1/1988 | Beeman | 364/717 |
| 4,769,777 | 9/1988 | Bittle | 364/717 |

FOREIGN PATENT DOCUMENTS 43-14898  6/1968  Japan .
1-12446   4/1989  Japan .

Primary Examiner—Long T. Nguyen
Attorney, Agent, or Firm—Wolf, Greenfield & Sacks

[57] ABSTRACT

A digital noise generator for transmitting white noise during a period when a digital telephone speech signal is absent. The digital noise generator includes a pseudo-random bit sequence generator, an amplitude control circuit, and a PCM code-word-generating shift register. A pseudo-random bit sequence is generated by the pseudo-random bit sequence generator, an amplitude code-word is generated by the amplitude control circuit, and pseudo-random noise signal is generated and outputted by the PCM code-word-generating shift register on the basis of the pseudo-random bit sequence and the amplitude code-word.

20 Claims, 5 Drawing Sheets

DIGITAL NOISE GENERATOR

BACKGROUND OF THE INVENTION

1. Field of the Invention

The present invention relates to a digital noise generator for generating pseudo-random noise subjected to amplitude control and pulse code modulation (hereinafter referred to as PCM) coding. The digital noise generator is used to alleviate the listener's discomfort occurring during so-called inactivity periods when no signal is transmitted from the speaker side. Specifically, the digital noise generator is employed in, for instance, digital speech interpolation (hereinafter referred to as the DSI) equipment in which only signals with voice activity are transmitted among digitized telephone speech signals, digital circuit multiplication equipment (hereinafter referred to as the DCME) which is a combination of the DSI equipment and a low-bit-rate speech coding technique, and a voice packet transmission equipment.

2. Description of the Related Arts

Conventionally, various circuit configurations are known as digital noise generators for generating pseudo-random noise.

FIG. 2 illustrates an example of a configuration of a conventional digital noise generator. This configuration is disclosed in Japanese Utility Model Publication No. 12446/1989.

This digital noise generator has a pseudo-random bit sequence generator 3 which is composed of an exclusive-OR circuit 1 and an n-bit shift register 2.

Furthermore, this digital noise generator has a pulse amplitude modulation circuit (hereinafter referred to as the PAM circuit) 4. The PAM circuit 4 includes both a weighting circuit 5 including a plurality of weighting resistors 6 and an adder 7 for adding outputs of the weighting circuit 5 together.

A description will now be given of the operation of this digital noise generator.

The exclusive-OR circuit 1 fetches an output and intermediate output of the shift register 2, performs an exclusive-OR operation with respect to these outputs, and feeds back the computed result to the shift register 2. Here, by the intermediate output of the shift register 2 is meant a signal representing the value of a predetermined bit of the n-bit shift register 2.

As a result of the above-described configuration, the value of the bits of the shift register 2 becomes one which is generally called a pseudo-random bit sequence.

Furthermore, since each bit of the shift register 2 is connected to one end of each weighting resistor 6, a signal obtained by adding the outputs of the weighting circuit 5 by means of the adder 7 becomes a signal representing a value in which the values of the bits of the shift register 2 are weighted and added together, i.e., a pulse amplitude-modulated signal.

The signal thus obtained is called the pseudo-random noise signal. This pseudo-random noise signal is used as white noise in the aforementioned DSI equipment and other similar equipments. In such an application, it is necessary to set the number n of the bits of the shift register 2 to a sufficiently large magnitude.

FIG. 3 illustrates a second example of the circuit configuration of the digital noise generator in accordance with the prior art.

In this circuit configuration, an improvement is made on the configuration of the weighting circuit 5 in the circuit configuration shown in FIG. 2. This circuit includes a sequence generator 13 like the generator 3 of FIG. 2. This sequence generator 13 specifically comprises an exclusive-OR circuit 11 that receives as inputs an output and an intermediate output of an n-bit shift register 12. The exclusive-OR 11 also reinputs its output to the shift register 12. Each bit of the shift register 12 is connected as a data bit to a PAM circuit 14. This PAM circuit includes a weighing circuit 15 and an adder 17.

In other words, a weighting circuit 15 in FIG. 3 includes an n-number of AND circuits 18 (1-n) and an n-number of scale factor circuits 19 (1-n) that are both connected to output terminals of the AND circuits 18.

The bit data of the shift register 12 are respectively inputted to the input terminals of the AND circuits 18, and an amplitude control signal is also inputted thereto from an external circuit.

The amplitude control signal is used to select which bit of the shift register 12 is to be added by an adder 17.

That is, each of the AND circuits 18 outputs the bit data of the shift register 12 to a corresponding one of the scale factor circuits 19 (1-n) in response to the amplitude control signal. Each of the scale factor circuits 19 weights the data supplied from the corresponding AND circuit 18, and outputs the result to the adder 17. The pseudo-random noise signal is outputted from the adder 17 in the same way as the prior art shown in FIG. 2.

Accordingly, in this prior art it is possible to control the amplitude of the pseudo-random noise signal by adjusting the number of bits to be added by means of the amplitude control signal.

FIG. 4 illustrates a third example of the circuit configuration of the conventional digital noise generator. A sequence generator 23 similar to those of FIGS. 2 and 3 is shown that includes an exclusive-OR circuit 21 having inputs from an intermediate output and an output of an n-bit shift register 22. The exclusive-OR 21 also reinputs its output to the shift register 22. Each bit output from the shift register 22 is input as a data bit to a PAM circuit 24, similar to that shown in FIG. 3, that includes a weighing circuit 25 and an adder 27. The weighing circuit comprises a group of AND circuits 28 (1-n) each connected to a corresponding scale factor circuit 29 (1-n). The bit data of the shift register 22 are respectively input to the input terminals of the AND circuits 28 (1-n)along with an input from an amplitude control signal similar to that shown in FIG. 3. Outputs of each of the AND circuits 28 (1-n) are then input to a corresponding scale factor circuit 29 (1-n), also similar to those shown in FIG. 3. Each bit output from the weighing circuit 25 is then input to an adder 27 in the same manner as in the FIG. 3 embodiment.

The configuration of this digital noise generator is such that a PAM/PCM converter 30 is added to the configuration shown in FIG. 3.

In other words, the pseudo-random noise signal outputted from an adder 27 is a pulse amplitude-modulated signal, i.e., a PAM signal. In cases where a PCM noise signal is required in DSI equipment or the like, it is necessary to generate a PCM pseudo-random noise signal by converting the PAM signal to a PCM signal. The PAM/PCM converter 30 performs this PAM/PCM conversion.

The digital noise generators provided with the above-described configurations have the following problems:

1) A large-scale circuit configuration is necessary for securing the randomness of the pseudo-random noise signal.

In other words, the greater the number of bits of a shift register subject to addition by the adder, the greater the randomness of the pseudo-random noise signal.

Accordingly, in order to enhance the randomness of the pseudo-random noise signal, it is significant to increase the number of bits of the shift register. However, an increase in the number of bits of the shift register leads to greater numbers of AND circuits and scale factor circuits both corresponding to the respective bits. These are a factor enlarging the circuit configuration.

Meanwhile, if the weighting by the use of the scale factor circuits is effected with a greater weight, it is possible to enhance the randomness of the pseudo-random noise signal without resulting in an increased number of bits of the shift register. In this case, however, the code length becomes longer in correspondence with the degree of weighting, so that the configuration of the adder becomes complicated.

2) In order to generate the pseudo-random noise signal of PCM, a PAM/PCM converter is necessary, so that the circuit configuration becomes complicated.

SUMMARY OF THE INVENTION

Accordingly, an object of the present invention is to realize a pseudo-random noise signal having a sufficient amplitude characteristic and randomness through a simpler circuit configuration, thereby overcoming the above-described drawbacks of the conventional art.

To this end, a digital noise generator in accordance with the present invention comprises:

1) a pseudo-random bit sequence generator for generating and outputting a pseudo-random bit sequence;

2) an amplitude control circuit for converting an amplitude control signal supplied from an external circuit to an amplitude code-word in accordance with a predetermined conversion rule; and 3) a PCM code-generating shift register which fetches the pseudo-random bit sequence and the amplitude signal and generates and outputs a pseudo-random noise signal which is a PCM code.

A description will be given hereinunder of the operation of the digital noise generator having the above-described configuration. First, a pseudo-random bit sequence is generated by the pseudo-random bit sequence generator. Meanwhile, an amplitude control signal is converted to an amplitude signal. This conversion is effected on the basis of a predetermined conversion rule.

Furthermore, the pseudo-random bit sequence and the amplitude signal are fetched by the PCM code-generating shift register and are outputted as a pseudo-random noise signal which is a PCM code.

Generally, the randomness of a pseudo-random noise signal in PCM means uniformity in the signal strength of a pseudo-random noise signal. Since the pseudo-random noise signal has a discrete spectrum, the randomness is determined by a pitch $\Delta f$ of a frequency spectrum and the amplitude of the frequency spectrum.

For instance, in a spectrum distribution shown in FIG. 5, the state in which the pitch $\Delta f$ of a frequency spectrum of the pseudo-random noise signal is sufficiently small and the amplitude is substantially fixed is referred to as a state of good randomness.

The pitch $\Delta f$ of the frequency spectrum is determined by the following formula in correspondence with a number of samples Nmax and a sampling period T:

$$\Delta f = 1/(Nmax \times T)$$

where Nmax is the length of the pseudo-random bit sequence.

Accordingly, if the number of samples Nmax is sufficiently large, the pitch $\Delta f$ of the frequency spectrum of the pseudo-random noise signal becomes small, and an amplitude-frequency characteristic which is closer to white noise is obtained.

Meanwhile, the amplitude of a pseudo-random noise signal is determined by an amplitude code-word which is an output of the amplitude control circuit. That is, the amplitude control signal determines the amplitude of the pseudo-random noise signal outputted from the PCM code-generating shift register.

Accordingly, the conventional AND circuits, scale factor circuits, adder circuit, and PAM/PCM converter can be dispensed with, and the randomness and a good amplitude characteristic can be realized with a simple configuration.

As a means for converting the amplitude control signal to the amplitude code-word, there is a means in which a nonvolatile memory is incorporated in the amplitude control circuit, and a code conversion table is stored in the nonvolatile memory so as to refer to the code conversion table.

The code conversion table is prepared in advance in accordance with a predetermined conversion rule. As the conversion rule, it suffices to adopt, for instance, a conversion rule based on the μ-law PCM coding rule or the A-law PCM coding rule that is stipulated in the CCITT recommendation G.711, or a conversion rule based on a linear PCM coding rule.

The PCM code-word-generating shift register operates in response to a PCM sampling clock signal of a predetermined period and a serial clock for outputting a PCM code-word, both supplied from an external circuit.

The PCM sampling clock signal is supplied to the pseudo-random bit sequence generator and the PCM code-word-generating shift register. An output timing of the pseudo-random bit sequence generator and an input timing of the PCM code-word-generating shift register are synchronized with each other by means of the PCM sampling clock signal.

The serial clock for outputting a PCM code-word is a clock for imparting a serial output timing of a pseudo-random noise signal from the PCM code-word-generating shift register.

In addition, the pseudo-random bit sequence generated by the pseudo-random bit sequence generator and the amplitude code-word generated by the amplitude control circuit are stored in the PCM code-word-generating shift register. For instance, the pseudo-random bit sequence is stored in the most significant bit of the PCM code-word-generating shift register, and the amplitude code-word in the remaining bits.

In other words, if the number of bits of the PCM code-word-generating shift register is set to 8, the pseudo-random bit sequence is stored in the 0th bit, and the amplitude code-word in the 1st to 7th bits.

In a PCM coding rule, the 0th bit generally indicates the polarity. Accordingly, the amplitude of the pseudo-random noise signal is determined by the 1st to 7th bits of the PCM code-word-generating shift register.

As described above, in accordance with the present invention, it is possible to control the amplitude of the pseudo-random noise signal without depending on the configuration of the pseudo-random bit sequence generator. In addition, in accordance with the present invention, it is possible to secure a necessary degree of randomness for the pseudo-random noise signal. Furthermore, the pseudo-random noise signal outputted from the PCM code-word-generating shift register conforms to the PCM coding rule, and the configuration of PAM/PCM converter becomes unnecessary. Moreover, since the code conversion table for signal conversion in the amplitude control circuit can be calibrated in correspondence with a PCM coding rule, the digital noise generator in accordance with the present invention can be adapted to various PCM coding rules.

DESCRIPTION OF THE PREFERRED EMBODIMENT

Figure 1:
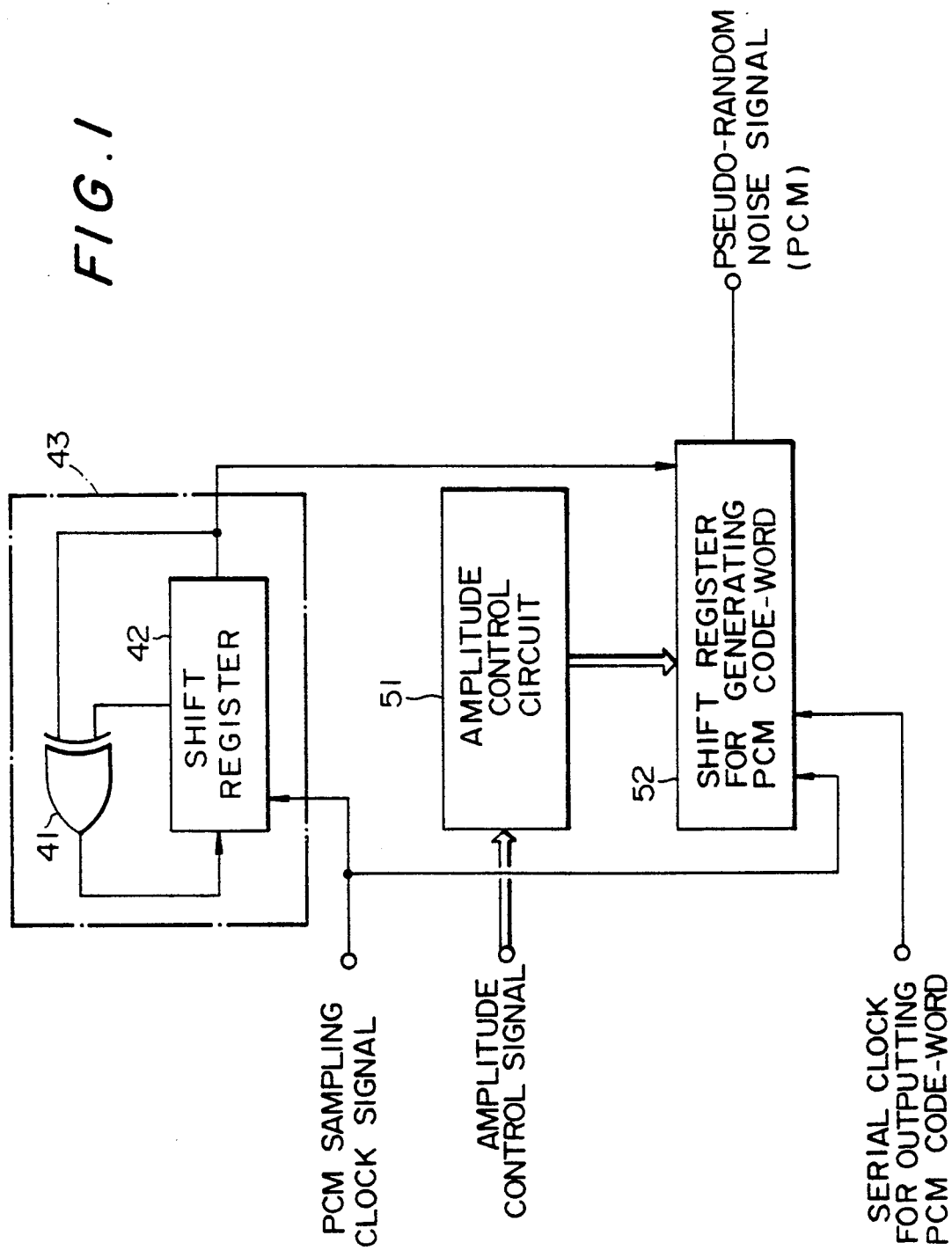
FIG. 1 is a circuit diagram illustrating a configuration of a digital noise generator in accordance with an embodiment of the present invention, in which a pseudo-random bit sequence generator 43 and an amplitude control circuit 51 are connected to a PCM code-word-generating shift,, register 52.

FIG. 1 illustrates a configuration of a digital noise generator in accordance with an embodiment of the present invention.

The digital noise generator comprises a pseudo-random bit sequence generator 43 including an exclusive-OR circuit 41 and a shift register 42; an amplitude control circuit 51; and a PCM code-word-generating shift register 52.

The pseudo-random bit sequence generator 43 and the amplitude control circuit 51 are connected to the PCM code-word-generating shift register 52.

A description will be given hereinunder of the operation of this embodiment.

An output and intermediate output of the shift register 42 are subjected to an exclusive-OR operation by the exclusive-OR circuit 41 in the same way as the above-described conventional art. A signal obtained as a result of this operation is fed back to the shift register 42. As this operation is repeated with respect to the respective bits of the shift register 42, the output of the shift register 42 constitutes a so-called pseudo-random bit sequence.

Meanwhile, an amplitude control signal supplied from an external circuit is converted to an amplitude code-word on the basis of a code conversion table stored in a nonvolatile memory incorporated in the amplitude control circuit 51.

In this embodiment, the code conversion table is based on the μ-law PCM coding rule stipulated in the International Telegraph and Telephone Consultative Committee (CCITT) recommendation G.711.

The pseudo-random bit sequence and the amplitude code-word are stored in each bit of the PCM code-word-generating shift register 52.

According to Recommendation G.711 published in Geneva, 1989, there are two encoding laws recommended. These are the μ-law and the A-law, as defined in Tables 1A and 1B, and Tables 2A and 2B, respectively. In implementing these encoding laws, "eight binary digits per sample should be used for international circuits."

Further, according to Recommendation G.711,

[w]hen using the μ-law in networks where suppression of the all 0 character signal is required, the character signal corresponding to negative input values between decision values numbers 127 and 128 should be 00000010 and the value at the decoder output is −7519. The corresponding decoder output value number is 125.

Figure 2:
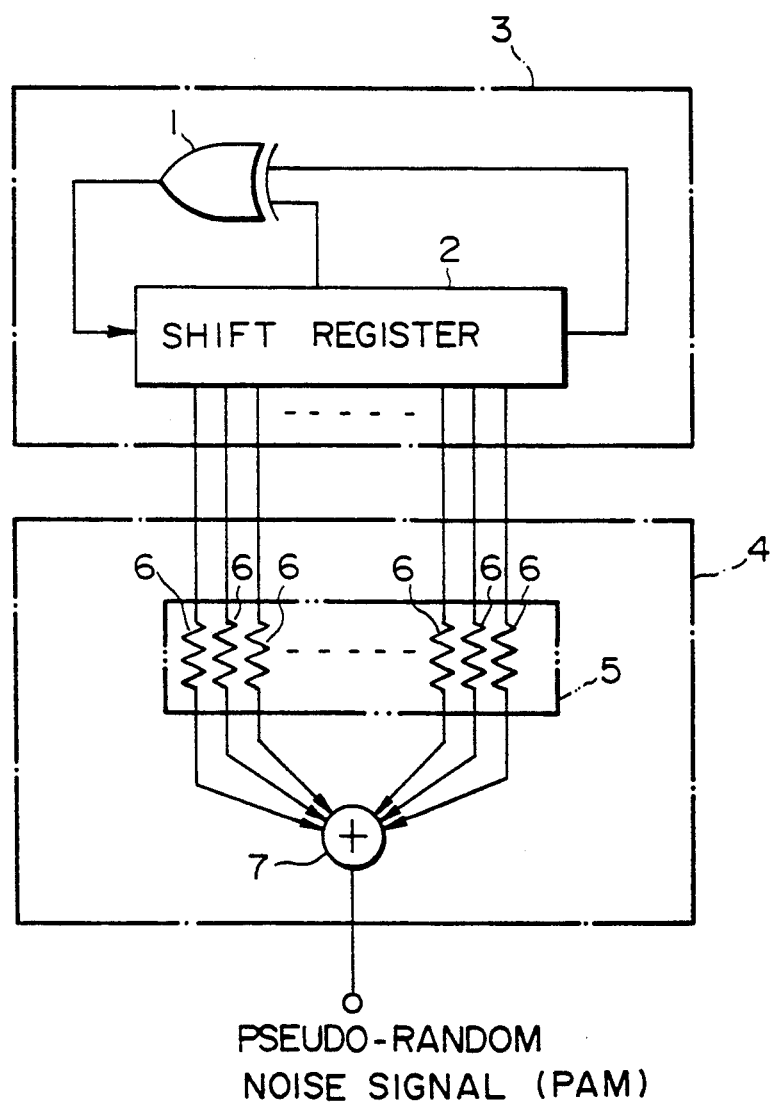
FIG. 2 is a circuit diagram illustrating a configuration of a digital noise generator in accordance with a first prior art.
Figure 3:
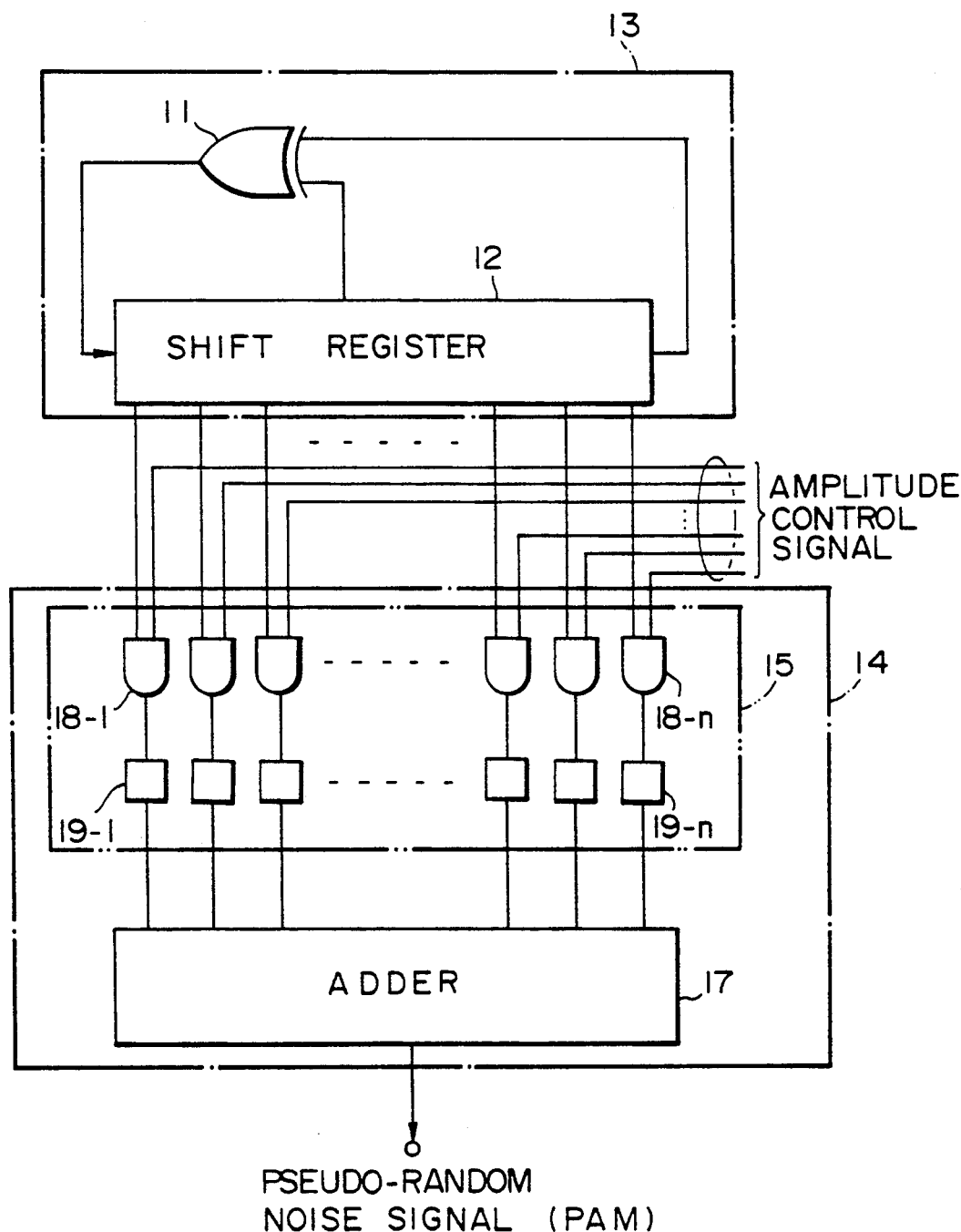
FIG. 3 is a circuit diagram illustrating a configuration of a digital noise generator in accordance with a second prior art.
Figure 4:
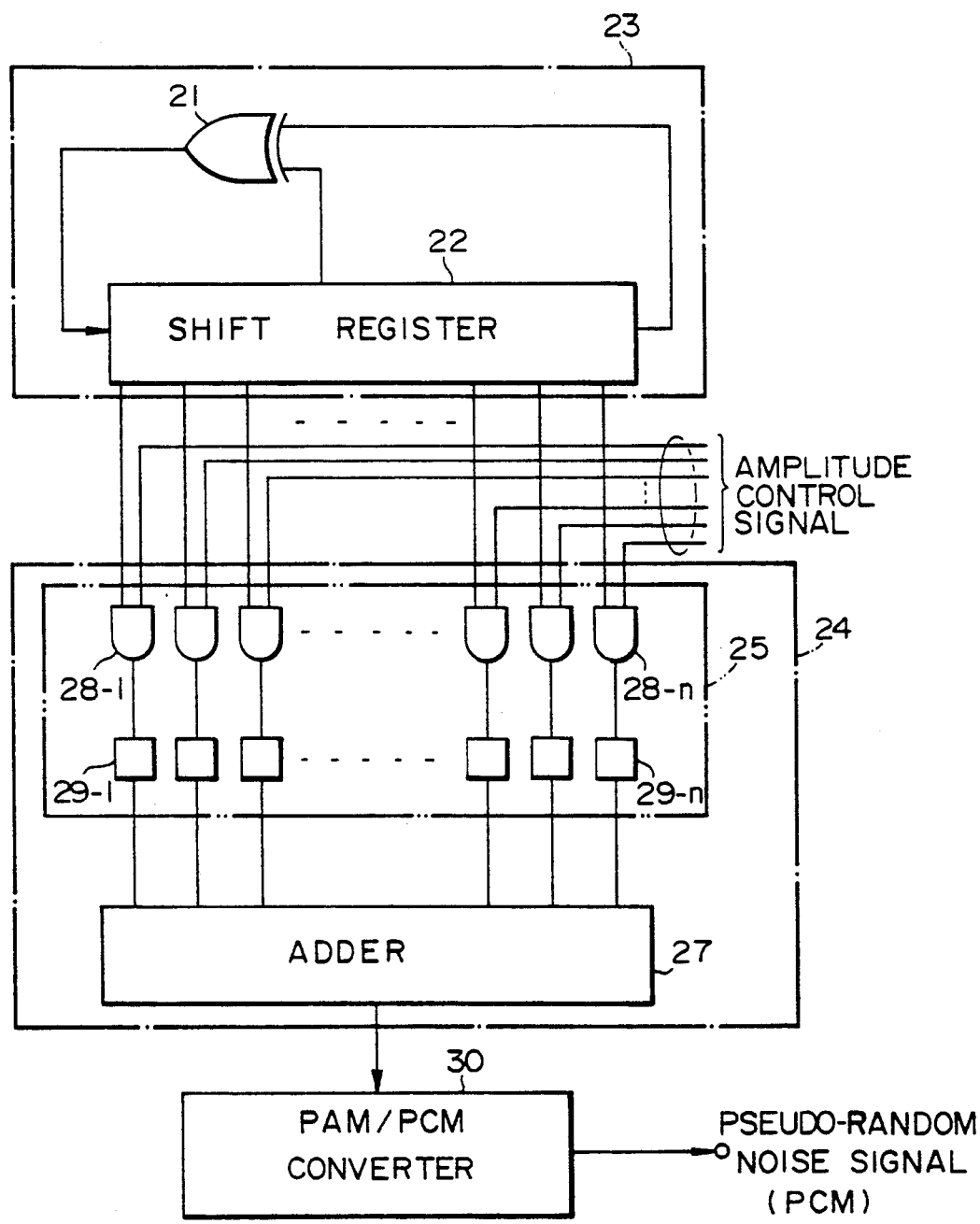
FIG. 4 is a circuit diagram illustrating a configuration of a digital noise generator in accordance with a third prior art.

... Every "decision value" and "quantized value" of the A (resp. μ) law should be associated with a "uniform PCM value". (For a definition of "decision value" and "quantized value", see Recommendation G.701 and in particular FIG. 2/G.701). This required the application of a 13 (14) bit uniform PCM code. The mapping from A-law PCM, and μ-law PCM, respectively, to the uniform code is given in Tables [1A and 1B,] and [Tables 2A and 2B].

... When character signals are transmitted serially, i.e. consecutively on one physical medium, bit No. 1 (polarity bit) is transmitted first and No. 8 (the least significant bit) last.

... The relationship between the encoding laws of Tables [1A, 1B, 2A and 2B] and the audio signal level is defined as follows:

A sine-wave signal of 1 kHz at a nominal level of dBmO should be present at any voice frequency output of the PCM multiplex when the periodic sequence of character signals of Table [3] for the A-law and of Table [4] for the μ-law is applied to the decoder input.

The resulting theoretical load capacity ($T_{max}$) is +3.14 dBmO for the A-law, and +3.17 dBmO for the μ-law.

Note—The use of another digital periodic sequence representing a nominal reference frequency of 1020 Hz at a nominal level of −10 dBmO (preferred value, see Recommendation 0.6) or 0 dBmO is acceptable, provided that the theoretical accuracy of that sequence does not differ by more than +/−0.03 dB from a level of −10 dBmO or 0 dBmO respectively. In accordance with Recommendation 0.6, the specified frequency tolerance should be 1020 Hz+2 Hz,−7 Hz.

If a sequence representing −10 dBmO is used, the nominal value at the voice frequency outputs should be −10 dBmo.

Notes relative to Table 1A

Note 1—4096 normalized value units correspond to $T_{max}=3.14$ dBmO.

Note 2—The character signals are obtained by inverting the even bits of the signals of column 6. Before this inversion, the character signal corresponding to positive input values between two successive decision values numbered n and N+1 (see column 4) is (128+n) expressed as a binary number.

Note 3—The value at the decoder output is $$y_n = \frac{X_{n-1} + X_n}{2} \text{ for } n = 1, \ldots, 127, 128.$$

Note 4—$x_{128}$ is a virtual decision value.

Note 5—In Tables 1 and 2 the values of the uniform code are given in columns 3, 5 and 7.

Notes relative to Table 1B

Note 1—4096 normalized value units correspond to $T_{max}=3.14$ dBmO.

Note 2—The character signals are obtained by inverting the even bits of the signals of column 6. Before this inversion, the character signal corresponding to negative input values between two successive decision values numbered n and n+1 (see column 4) is n expressed as a binary number.

Note 3—the value at the decoder output is $$y_n = \frac{X_{n-1} + X_n}{2} \text{ for } n = 1, \ldots, 127, 128.$$

Note 4—$x_{128}$ is a virtual decision value.

Note 5—In Tables 1 and 2 the values of the uniform code are given in columns 3, 5 and 7.

Notes relative to Table 2A

Note 1—8159 normalized value units correspond to $T_{max}=3.17$ dBmO.

Note 2—The character signal corresponding to positive input values between two successive decision values numbered n and N+1 (see column 4) is (255-n) expressed as a binary number.

Note 3—The value at the decoder output is $Y_0 = x_0 = 0$ for n=0, and $$y_n = \frac{X_{n-1} + X_n}{2} \text{ for } n = 1, 2, \ldots, 127.$$

Note 4—$x_{128}$ is a virtual decision value.

Note 5—In Tables 1 and 2 the values of the uniform code are given in columns 3, 5 and 7.

Notes relative to Table 2B

Note 1—8159 normalized value units correspond to $T_{max}=3.17$ dBmO.

Note 2—The character signal corresponding to negative input values between two successive decision values numbered n and n+1 (see column 4) is (127-n) expressed as a binary number for n=0, 1, ..., 127.

Note 3—The value at the decoder output is $Y_0 = x_0 = O$ for n=0, and $$y_n = \frac{X_{n-1} + X_n}{2} \text{ for } n = 1, 2, \ldots, 127.$$

Note 4—$x_{128}$ is a virtual decision value.

Note 5—In Tables 1 and 2 the values of the uniform code are given in columns 3, 5 and 7.

TABLE 1A

A-law, positive input values

| 1 Segment number | 2 Number of intervals x interval size | 3 Value at segment end points | 4 Decision value number n | 5 Decision value $x_n$ (see Note 1) | 6 Character signal before inversion of the even bits Bit number 1 2 3 4 5 6 7 8 | 7 Quantized value (value at decoder output) $y_n$ | 8 Decoder output value number |
|---|---|---|---|---|---|---|---|
| | | 4096 | (128) | (4096) | | | |
| | | | | | 1 1 1 1 1 1 1 1 - | 4032 | 128 |
| | | | 127 | 3968 | | | |
| 7 | 16 × 128 | | | | (see Note 2) | | |
| | | | 113 | 2176 | | | |
| | | | | | 1 1 1 1 0 0 0 0 - | 2112 | 113 |
| | | 2048 | 112 | 2048 | | | |
| 6 | 16 × 64 | | | | (see Note 2) | | |
| | | | 97 | 1088 | | | |
| | | | | | 1 1 1 0 0 0 0 0 - | 1056 | 97 |
| | | 1024 | 96 | 1024 | | | |
| 5 | 16 × 32 | | | | (see Note 2) | | |
| | | | 81 | 544 | | | |
| | | | | | 1 1 0 1 0 0 0 0 - | 528 | 81 |
| | | 512 | 80 | 512 | | | |
| 4 | 16 × 16 | | | | (see Note 2) | | |
| | | | 65 | 272 | | | |
| | | | | | 1 1 0 0 0 0 0 0 - | 264 | 65 |
| | | 256 | 64 | 256 | | | |
| 3 | 16 × 8 | | | | (see Note 2) | | |
| | | | 49 | 136 | | | |
| | | | | | 1 0 1 1 0 0 0 0 - | 132 | 49 |

TABLE 1A-continued

A-law, positive input values

| 1 Segment number | 2 Number of intervals x interval size | 3 Value at segment end points | 4 Decision value number n | 5 Decision value $x_n$ (see Note 1) | 6 Character signal before inversion of the even bits Bit number 1 2 3 4 5 6 7 8 | 7 Quantized value (value at decoder output) $y_n$ | 8 Decoder output value number |
|---|---|---|---|---|---|---|---|
| 2 | 16 × 4 | 128 | 48 ⋮ 33 | 128 ⋮ 68 | (see Note 2) 1 0 1 0 0 0 0 0 - | 66 | 33 |
| 1 | 32 × 2 | 64 | 32 ⋮ 1 0 | 64 ⋮ 2 0 | (see Note 2) 1 0 0 0 0 0 0 0 - | 1 | 1 |

TABLE 1B

A-law, negative input values

| 1 Segment number | 2 Number of intervals x interval size | 3 Value at segment end points | 4 Decision value number n | 5 Decision value $x_n$ (see Note 1) | 6 Character signal before inversion of the even bits Bit number 1 2 3 4 5 6 7 8 | 7 Quantized value (value at decoder output) $y_n$ | 8 Decoder output value number |
|---|---|---|---|---|---|---|---|
| 1 | 32 × 2 | −64 | 0 1 ⋮ 32 | 0 −2 ⋮ −64 | 0 0 0 0 0 0 0 0 - (see Note 2) 0 0 1 0 0 0 0 0 - | −1 −66 | 1 33 |
| 2 | 16 × 4 | −128 | 33 ⋮ 48 | −68 ⋮ −128 | (see Note 2) 0 0 1 1 0 0 0 0 - | −132 | 49 |
| 3 | 16 × 8 | −256 | 49 ⋮ 64 | −136 ⋮ −256 | (see Note 2) 0 1 0 0 0 0 0 0 - | −264 | 65 |
| 4 | 16 × 16 | −512 | 65 ⋮ 80 | −272 ⋮ −512 | (see Note 2) 0 1 0 1 0 0 0 0 - | −528 | 81 |
| 5 | 16 × 32 | −1024 | 81 ⋮ 96 | −544 ⋮ −1024 | (see Note 2) 0 1 1 0 0 0 0 0 - | −1056 | 97 |
| 6 | 16 × 64 | −2048 | 97 ⋮ 112 | −1088 ⋮ −2048 | (see Note 2) 0 1 1 1 0 0 0 0 - | −2112 | 113 |
| 7 | 16 × 128 | −4096 | 113 ⋮ 127 (128) | −2176 ⋮ −3968 (−4096) | 0 1 1 1 1 1 1 1 - | −4032 | 128 |

TABLE 2A

μ-law, positive input values

| 1 Segment number | 2 Number of intervals x interval size | 3 Value at segment end points | 4 Decision value number n | 5 Decision value $x_n$ (see Note 1) | 6 Character signal Bit number 1 2 3 4 5 6 7 8 | 7 Quantized value (value at decoder output) $y_n$ | 8 Decoder output value number |
|---|---|---|---|---|---|---|---|
| | | 8159 | (128) | (8159) | | | |
| | | | | | 1 0 0 0 0 0 0 0 - | 8031 | 127 |
| 8 | 16 × 256 | | 127 | 7903 | | | |
| | | | ⋮ | ⋮ | (see Note 2) | | |
| | | | 113 | 4319 | | | |
| | | | | | 1 0 0 0 1 1 1 1 - | 4191 | 112 |
| | | 4063 | 112 | 4063 | | | |
| 7 | 16 × 128 | | ⋮ | ⋮ | (see Note 2) | | |
| | | | 97 | 2143 | | | |
| | | | | | 1 0 0 1 1 1 1 1 - | 2079 | 96 |
| | | 2015 | 96 | 2015 | | | |
| 6 | 16 × 64 | | ⋮ | ⋮ | (see Note 2) | | |
| | | | 81 | 1055 | | | |
| | | | | | 1 0 1 0 1 1 1 1 - | 1023 | 80 |
| | | 991 | 80 | 991 | | | |
| 5 | 16 × 32 | | ⋮ | ⋮ | (see Note 2) | | |
| | | | 65 | 511 | | | |
| | | | | | 1 0 1 1 1 1 1 1 - | 495 | 64 |
| | | 479 | 64 | 479 | | | |
| 4 | 16 × 16 | | ⋮ | ⋮ | (see Note 2) | | |
| | | | 49 | 239 | | | |
| | | | | | 1 1 0 0 1 1 1 1 - | 231 | 48 |
| | | 223 | 48 | 223 | | | |
| 3 | 16 × 8 | | ⋮ | ⋮ | (see Note 2) | | |
| | | | 33 | 103 | | | |
| | | | | | 1 1 0 1 1 1 1 1 - | 99 | 32 |
| | | 95 | 32 | 95 | | | |
| 2 | 16 × 4 | | ⋮ | ⋮ | (see Note 2) | | |
| | | | 17 | 35 | | | |
| | | | | | 1 1 1 0 1 1 1 1 - | 33 | 16 |
| | | 31 | 16 | 31 | | | |
| | 15 × 2 | | ⋮ | ⋮ | (see Note 2) | | |
| | | | 2 | 3 | | | |
| | | | | | 1 1 1 1 1 1 1 0 - | 2 | 1 |
| 1 | | | 1 | 1 | 1 1 1 1 1 1 1 1 | 0 | 0 |
| | 1 × 1 | | 0 | 0 | | | |

TABLE 2B

μ-law, negative input values

| 1 Segment number | 2 Number of intervals x interval size | 3 Value at segment end points | 4 Decision value number n | 5 Decision value $x_n$ (see Note 1) | 6 Character signal Bit number 1 2 3 4 5 6 7 8 | 7 Quantized value (value at decoder output) $y_n$ | 8 Decoder output value number |
|---|---|---|---|---|---|---|---|
| | | | 0 | 0 | 0 1 1 1 1 1 1 1 | 0 | 0 |
| | 1 × 1 | | 1 | −1 | | | |
| | | | | | 0 1 1 1 1 1 1 0 - | −2 | 1 |
| 1 | | | 1 | −3 | | | |
| | 15 × 2 | | ⋮ | ⋮ | (see Note 2) | | |
| | | −31 | 16 | −31 | | | |
| | | | | | 0 1 1 0 1 1 1 1 - | −33 | 16 |
| | | | 17 | −35 | | | |
| 2 | 16 × 4 | | ⋮ | ⋮ | (see Note 2) | | |
| | | −95 | 32 | −95 | | | |
| | | | | | 0 1 0 1 1 1 1 1 - | −99 | 32 |

TABLE 2B-continued

μ-law, negative input values

| 1 Segment number | 2 Number of intervals x interval size | 3 Value at segment end points | 4 Decision value number n | 5 Decision value $x_n$ (see Note 1) | 6 Character signal Bit number 1 2 3 4 5 6 7 8 | 7 Quantized value (value at decoder output) $y_n$ | 8 Decoder output value number |
|---|---|---|---|---|---|---|---|
| 3 | 16 × 8 |  | 33 | −103 | (see Note 2) |  |  |
|  |  | −223 | 48 | −223 |  |  |  |
|  |  |  |  |  | 0 1 0 0 1 1 1 1 | −231 | 48 |
| 4 | 16 × 16 |  | 49 | −239 | (see Note 2) |  |  |
|  |  | −479 | 64 | −479 |  |  |  |
|  |  |  |  |  | 0 0 1 1 1 1 1 1 | −495 | 64 |
| 5 | 16 × 32 |  | 65 | −511 | (see Note 2) |  |  |
|  |  | −991 | 80 | −991 |  |  |  |
|  |  |  |  |  | 0 0 1 0 1 1 1 1 | −1023 | 80 |
| 6 | 16 × 64 |  | 81 | −1055 | (see Note 2) |  |  |
|  |  | −2015 | 96 | −2015 |  |  |  |
|  |  |  |  |  | 0 0 0 1 1 1 1 1 | −2079 | 96 |
| 7 | 16 × 128 |  | 97 | −4143 | (see Note 2) |  |  |
|  |  | −4063 | 112 | −4063 |  |  |  |
|  |  |  |  |  | 0 0 0 0 1 1 1 1 | −4191 | 112 |
| 8 | 16 × 256 |  | 113 | −4319 |  |  |  |
|  |  |  | 126 | −7647 |  |  |  |
|  |  |  |  |  | 0 0 0 0 0 0 0 1 | −7775 | 126 |
|  |  |  | 127 | −7903 |  |  |  |
|  |  |  |  |  | 0 0 0 0 0 0 0 0 | −8031 | 127 |
|  |  | −8159 | (128) | (−8159) |  |  |  |

TABLE 3

A-law

| 1 | 2 | 3 | 4 | 5 | 6 | 7 | 8 |
|---|---|---|---|---|---|---|---|
| 0 | 0 | 1 | 1 | 0 | 1 | 0 | 0 |
| 0 | 0 | 1 | 0 | 0 | 0 | 0 | 1 |
| 0 | 0 | 1 | 0 | 0 | 0 | 0 | 1 |
| 0 | 0 | 1 | 1 | 0 | 1 | 0 | 0 |
| 1 | 0 | 1 | 1 | 0 | 1 | 0 | 0 |
| 1 | 0 | 1 | 0 | 0 | 0 | 0 | 1 |
| 1 | 0 | 1 | 0 | 0 | 0 | 0 | 1 |
| 1 | 0 | 1 | 1 | 0 | 1 | 0 | 0 |

TABLE 4

μ-law

| 1 | 2 | 3 | 4 | 5 | 6 | 7 | 8 |
|---|---|---|---|---|---|---|---|
| 0 | 0 | 0 | 1 | 1 | 1 | 1 | 0 |
| 0 | 0 | 0 | 0 | 1 | 0 | 1 | 1 |
| 0 | 0 | 0 | 0 | 1 | 0 | 1 | 1 |
| 0 | 0 | 0 | 1 | 1 | 1 | 1 | 0 |
| 1 | 0 | 0 | 1 | 1 | 1 | 1 | 0 |
| 1 | 0 | 0 | 0 | 1 | 0 | 1 | 1 |
| 1 | 0 | 0 | 0 | 1 | 0 | 1 | 1 |
| 1 | 0 | 0 | 1 | 1 | 1 | 1 | 0 |

In this embodiment, the number of bits of the PCM code-word-generating shift register 52 is 8, and the pseudo-random bit sequence is fetched to the most significant 0th bit and the amplitude code-word to the 1st to 7th bits. The transmission and receipt of the pseudo-random bit sequence are effected in response to a PCM sampling clock signal of a predetermined period supplied from an external circuit.

In the μ-law PCM coding rule stipulated in the CCITT recommendation G.711, the most significant bit is a polarity bit indicating a polarity. If the polarity bit is "1", the sample value is positive, and if it is "0", the sample value is negative.

In this coding rule, the lower bits (in this embodiment, the lower seven bits) indicate the amplitude of a sample value. For instance, if the lower seven bits are "0000000", it indicates the maximum amplitude, while if it is "1111111", it indicates the minimum amplitude. Furthermore, the amplitude characteristic is a polygonal line characteristic composed of eight segments each for the positive and the negative, and this characteristic approximates a logarithmic characteristic.

Each time sampling is effected, data must be fed to the most significant bit of the PCM code-word-generating shift register 52, i.e., the polarity bit. To realize this, the PCM sampling clock is also supplied to the pseudo-random bit sequence generator 43 in the same way as described above.

The PCM code-word-generating shift register 52 generates a pseudo-random random noise signal which conforms to the PCM coding rule, on the basis of the pseudo-random bit sequence and the amplitude code-word thus stored.

In this embodiment, if an m-series pseudo-random bit sequence is to be generated using an n-bit shift register as the shift register 42, the length of the bit sequence, Nmax, becomes $2^n-1$. If it is assumed that the period T of the PCM sampling clock signal is 125 μsec, the pitch Δf of a frequency spectrum can be expressed by the following formula:

$$\Delta f = 8/(2^n-1) \text{ (kHz)}$$

Furthermore, the PCM code-word-generating shift register 52 outputs a pseudo-random noise signal in response to a serial clock signal for outputting a PCM code-word which is supplied from an external circuit.

Accordingly, the pseudo-random noise signal which conforms to the PCM coding rule is supplied to, for instance, the DSIE as white noise.

It should be noted that the PCM coding rule in the present invention is not restricted to the μ-law PCM coding rule stipulated in the CCITT recommendation G.711. For instance, it is possible to adopt and A-law PCM coding rule stipulated in said recommendation G.711. Furthermore, a linear coding rule may also be adopted. It suffices if the code conversion table is calibrated in correspondence with a coding rule adopted.

Figure 5:
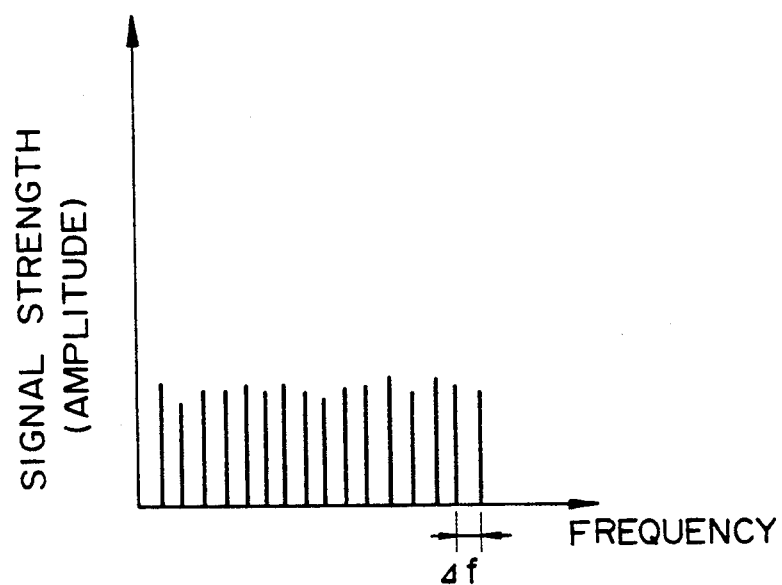
FIG. 5 is a diagram illustrating an amplitude-frequency characteristic of a pseudo-random noise signal.

As stated previously, the characteristics of this pseudo-random noise signal are fairly good, displaying a highly random pattern. This is evidenced by the spectrum distribution of FIG. 5. Such "good randomness" is attained specifically when the pitch Δf of the frequency spectrum of the pseudo-random noise signal is sufficiently small and the amplitude is substantially fixed.

Each of the above embodiments described herein is to be taken by way of example and is not intended to limit the spirit or scope of this invention. Any and all modification, variation and equivalents which may occur to those skilled in the art should be considered as falling within the scope of the invention as defined in the appended claims.

What is claimed is:

1. A digital noise generator comprising:
    a pseudo-random bit sequence generator for generating and outputting a pseudo-random bit sequence;
    an amplitude control circuit for converting an amplitude control signal supplied from an external circuit to an amplitude code-word in accordance with a predetermined conversion rule; and
    a pulse code modulation (PCM) code-word-generating shift register which fetches the pseudo-random bit sequence and the amplitude code-word and generates and outputs a pseudo-random noise signal which conforms to a PCM coding rule.

2. A digital noise generator according to claim 1, wherein said amplitude control circuit comprises a nonvolatile memory for storing a code conversion table based on a rule of conversion from the amplitude control signal to the amplitude code-word, the amplitude control signal being converted to the amplitude code-word by reference to said code conversion table.

3. A digital noise generator according to claim 2, wherein said nonvolatile memory stores said code conversion table for converting the amplitude control signal to the PCM code-word based on the μ-law PCM coding rule.

4. A digital noise generator according to claim 2, wherein said nonvolatile memory stores said code conversion table for converting the amplitude control signal to the PCM code-word based on the A-law PCM coding rule stipulated in the CCITT recommendation G.711.

5. A digital noise generator according to claim 2, wherein said nonvolatile memory stores said code conversion table for converting the amplitude control signal to the PCM code-word based on a linear PCM coding rule.

6. A digital noise generator according to claim 1, wherein said amplitude control circuit outputs said amplitude code-word, and said pseudo-random bit sequence generator outputs the pseudo-random bit sequence in response to a PCM sampling clock signal of a predetermined period which is supplied from an external circuit, and said PCM code-word-generating shift register fetches the pseudo-random bit sequence and the amplitude code-word in response to the PCM sampling clock signal.

7. A digital noise generator according to claim 6, wherein the pseudo-random bit sequence is stored in the most significant bit position of said PCM code-word-generating shift register and the amplitude code-word is stored in the remaining bit positions.

8. A digital noise generator according to claim 7, wherein said PCM code-word-generating shift register serially outputs the stored content as the pseudo-random noise signal in response to a serial clock signal.

9. A digital noise generator according to claim 8, wherein said PCM code-word-generating shift register is an 8-bit shift register.

10. A digital noise generator according to claim 7, wherein said PCM code-word-generating shift register is an 8-bit shift register.

11. A digital noise generator according to claim 6, wherein said PCM code-word-generating shift register serially outputs the stored content as the pseudo-random noise signal in response to a serial clock signal.

12. A digital noise generator according to claim 11, wherein said PCM code-word-generating shift register is an 8-bit shift-register.

13. A digital noise generator according to claim 6, wherein said PCM code-word-generating shift register is an 8-bit shift register.

14. A digital noise generator according to claim 1, wherein said PCM code-word-generating shift register serially outputs the pseudo-random noise signal in response to a serial clock signal.

15. A digital noise generator according to claim 14, wherein said PCM code-word-generating shift register is an 8-bit shift register.

16. A digital noise generator comprising:
    a pseudo-random bit sequence generator which includes a shift register with a predetermined number of bits and an exclusive-OR circuit for fetching an output and intermediate output of said shift register so as to determine an exclusive-OR and effect a feedback input to said shift register and which is adapted to output an output of said shift register as a pseudo-random bit sequence;
    an amplitude control circuit for converting an amplitude control signal supplied from an external circuit to an amplitude code-word in accordance with a predetermined conversion rule; and
    a pulse code modulation (PCM) code-word-generating shift register which fetches the pseudo-random bit sequence and the amplitude code-word and generates and outputs a pseudo-random noise signal which conforms to a PCM coding rule.

17. A digital noise generator according to claim 16, wherein said amplitude control circuit comprises a nonvolatile memory for storing a code conversion table based on a rule of conversion from the amplitude control signal to the amplitude code-word, the amplitude control signal being converted to the amplitude code-word by reference to said code conversion table.

18. A digital noise generator according to claim 17, wherein:
said nonvolatile memory stores said code conversion table for converting the amplitude control signal to the amplitude code-word based on the $\mu$-law PCM coding rule;
said pseudo-random bit sequence generator outputs the pseudo-random bit sequence in response to a PCM sampling clock signal of a predetermined period which is supplied from an external circuit;
said amplitude control circuit outputs the amplitude code-word in response to the PCM sampling clock signal;
said PCM code-word-generating shift register fetches the pseudo-random bit sequence and the amplitude code-word in response to the PCM sampling clock signal; and
the pseudo-random bit sequence is stored in the most significant bit position of said PCM code-word-generating shift register, said bit position indicating an output polarity, and the amplitude code-word is stored in the remaining bit positions.

19. A digital noise generator according to claim 18, wherein said PCM code-word-generating shift register serially outputs the pseudo-random noise signal in response to a serial clock signal.

20. A digital noise generator according to claim 19, wherein said PCM code-word-generating shift register is an 8-bit shift register.

* * * * *